US012777605B2

(12) United States Patent
Su et al.

(10) Patent No.: US 12,777,605 B2
(45) Date of Patent: Oct. 27, 2026

(54) SLIDE RAIL DEVICE FOR A SERVER RACK

(71) Applicant: FOSITEK CORPORATION, New Taipei City (TW)

(72) Inventors: Chia-Hung Su, New Taipei City (TW); Hao-Ping Wang, New Taipei City (TW)

(73) Assignee: FOSITEK CORPORATION, New Taipei City (TW)

( * ) Notice: Subject to any disclaimer, the term of this patent is extended or adjusted under 35 U.S.C. 154(b) by 24 days.

(21) Appl. No.: 19/002,407

(22) Filed: Dec. 26, 2024

(65) Prior Publication Data

US 2026/0089866 A1 Mar. 26, 2026

(30) Foreign Application Priority Data

Sep. 20, 2024 (TW) ................................ 113135840

(51) Int. Cl.
*H05K 7/14* (2006.01)
*A47B 88/44* (2017.01)

(52) U.S. Cl.
CPC ........... *H05K 7/1489* (2013.01); *A47B 88/44* (2017.01); *A47B 2210/007* (2013.01)

(58) Field of Classification Search
CPC ...... H05K 7/1489; A47B 88/40; A47B 88/44; A47B 2210/007; A47B 2210/0067
See application file for complete search history.

(56) References Cited

U.S. PATENT DOCUMENTS

| | | | | |
|---|---|---|---|---|
| 5,722,750 A * | 3/1998 | Chu | ..................... | A47B 88/493 312/334.46 |
| 6,454,372 B1 * | 9/2002 | Yang | .................... | A47B 88/493 312/334.45 |
| 2013/0077218 A1 * | 3/2013 | Zhang | .................. | H05K 7/1489 361/679.02 |
| 2019/0200756 A1 * | 7/2019 | Chen | .................... | A47B 88/473 |
| 2022/0065292 A1 * | 3/2022 | Chen | ...................... | A47B 88/44 |

(Continued)

FOREIGN PATENT DOCUMENTS

| | | |
|---|---|---|
| TW | M643804 U | 7/2023 |
| TW | 202345726 A | 12/2023 |

OTHER PUBLICATIONS

Search Report appended to an Office Action, which was issued to Taiwanese counterpart application No. 113135840 by the TIPO on Jun. 12, 2025, with an English translation thereof.

*Primary Examiner* — Daniel J Rohrhoff
(74) *Attorney, Agent, or Firm* — Birch, Stewart, Kolasch & Birch, LLP

(57) ABSTRACT

A slide rail device for connecting with a server case includes a middle rail unit and an inner rail unit. The middle rail unit includes a middle rail and a return abutting member disposed on the middle rail. The inner rail unit includes an inner rail slidable along the middle rail and having an engaging slot, a lock member engageable with an engaging member of the server case inserted into the engaging slot, and a releasing member operably moved to press the lock member away from an inner rail surface of the inner rail so as to release engagement of the lock member from the engaging member. During sliding movement of the inner rail unit relative to the middle rail in a retreating direction, the releasing member is moved to be pressed by the return abutting member to return to an original position thereof.

11 Claims, 20 Drawing Sheets

(56) References Cited

U.S. PATENT DOCUMENTS

| | | | | |
|---|---|---|---|---|
| 2022/0192376 | A1* | 6/2022 | Chen | A47B 88/57 |
| 2025/0204682 | A1* | 6/2025 | Chen | A47B 88/57 |
| 2025/0366611 | A1* | 12/2025 | Chen | A47B 88/443 |
| 2026/0089866 | A1* | 3/2026 | Su | H05K 7/1489 |

* cited by examiner

SLIDE RAIL DEVICE FOR A SERVER RACK

CROSS-REFERENCE TO RELATED APPLICATION

This application claims priority to Taiwanese Patent Application No. 113135840, filed on Sep. 20, 2024, and incorporated by reference herein in its entirety.

FIELD

The disclosure relates to a slide rail device for a server rack, and more particularly to a slide rail device for connecting with a server case.

BACKGROUND

In a conventional server rack, a releasably positioning structure is mounted to a slide rail device through a biasing member. A server case is connected with and mounted on the slide rail device and positioned thereon by means of T-type fasteners with biasing members. Hence, the biasing members need to be manually operated so the server case may be removed from the slide rail device; such operation may hurt the user's hand and is inconvenient. Moreover, the user needs to manually operate the releasing member of the releasably positioning structure for the releasing member to return to an original position thereof so as to lock the server case to the slide rail device when the server case is mounted on the slide rail device again. Otherwise, there may be a risk of undesired removal of the server case from the slide rail device, which may cause damage to other server cases or injuries to the user.

SUMMARY

Therefore, an object of the disclosure is to provide a slide rail device that can alleviate at least one of the drawbacks of the prior art.

According to the disclosure, the slide rail device is for connecting with a server case. The server case has an engaging member. The slide rail device includes a middle rail unit and an inner rail unit. The middle rail unit includes a middle rail and a return abutting member disposed on the middle rail. The inner rail unit includes an inner rail which is disposed on and longitudinally slidable along the middle rail, a lock member which is disposed on the inner rail, and a releasing member which is disposed on the inner rail and movably connected with the lock member. The inner rail has an inner rail surface facing the middle rail, a first end, a second end longitudinally opposite to the first end, and an engaging slot formed therethrough for the engaging member to be transversely inserted thereinto. The lock member is engageable with the engaging member to prevent removal of the engaging member from the engaging slot. The releasing member is operably moved longitudinally toward the second end to abut and press the lock member away from the inner rail surface so as to release engagement of the lock member from the engaging member. During sliding movement of the inner rail unit relative to the middle rail in a retreating direction, the releasing member is moved to be in abutting engagement with and pressed by the return abutting member to return toward the first end to an original position thereof.

BRIEF DESCRIPTION OF THE DRAWINGS

Other features and advantages of the disclosure will become apparent in the following detailed description of the embodiment with reference to the accompanying drawings. It is noted that various features may not be drawn to scale.

DETAILED DESCRIPTION

Figure 1:
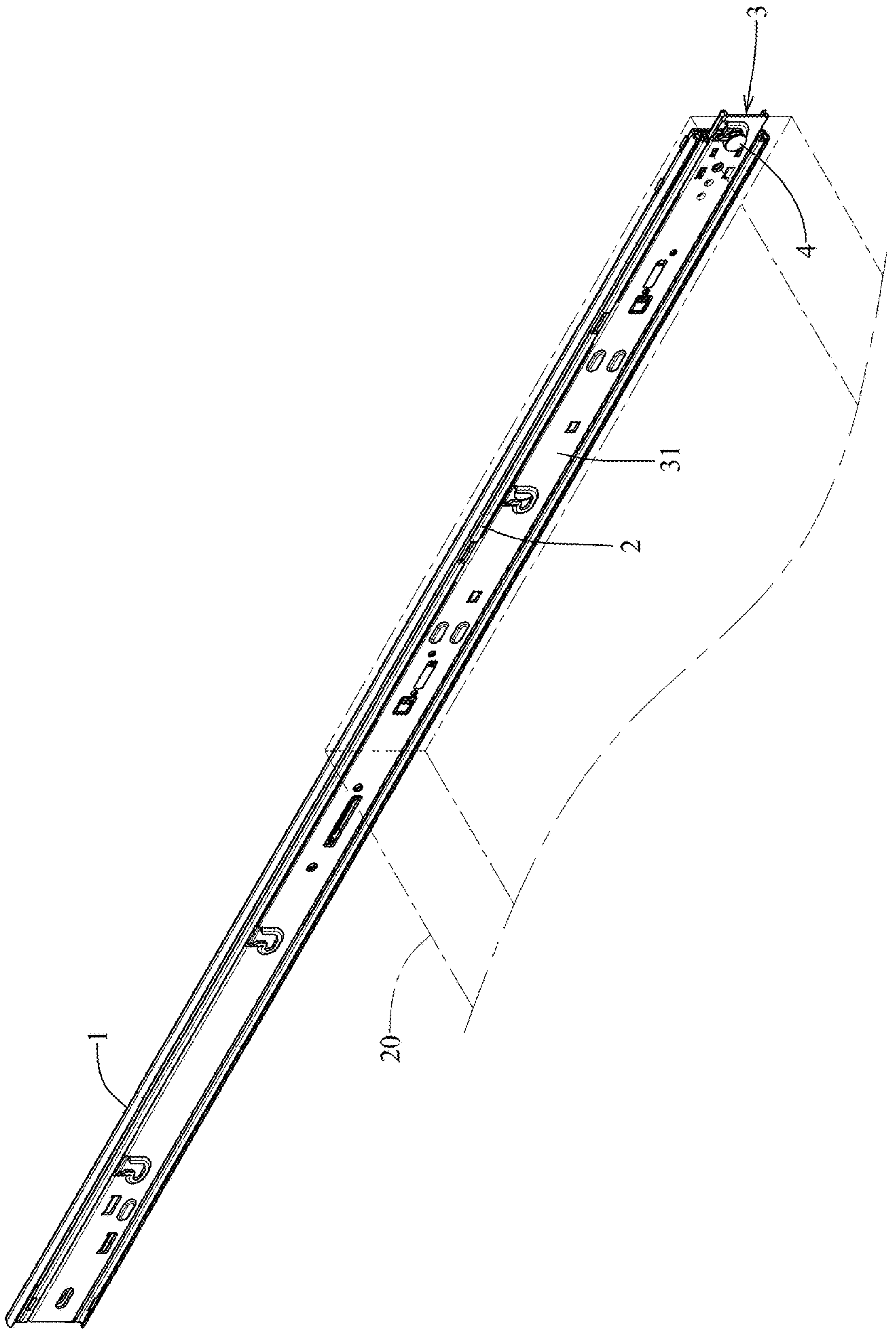
FIG. 1 is a perspective view illustrating an embodiment of a slide rail device according to the disclosure.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
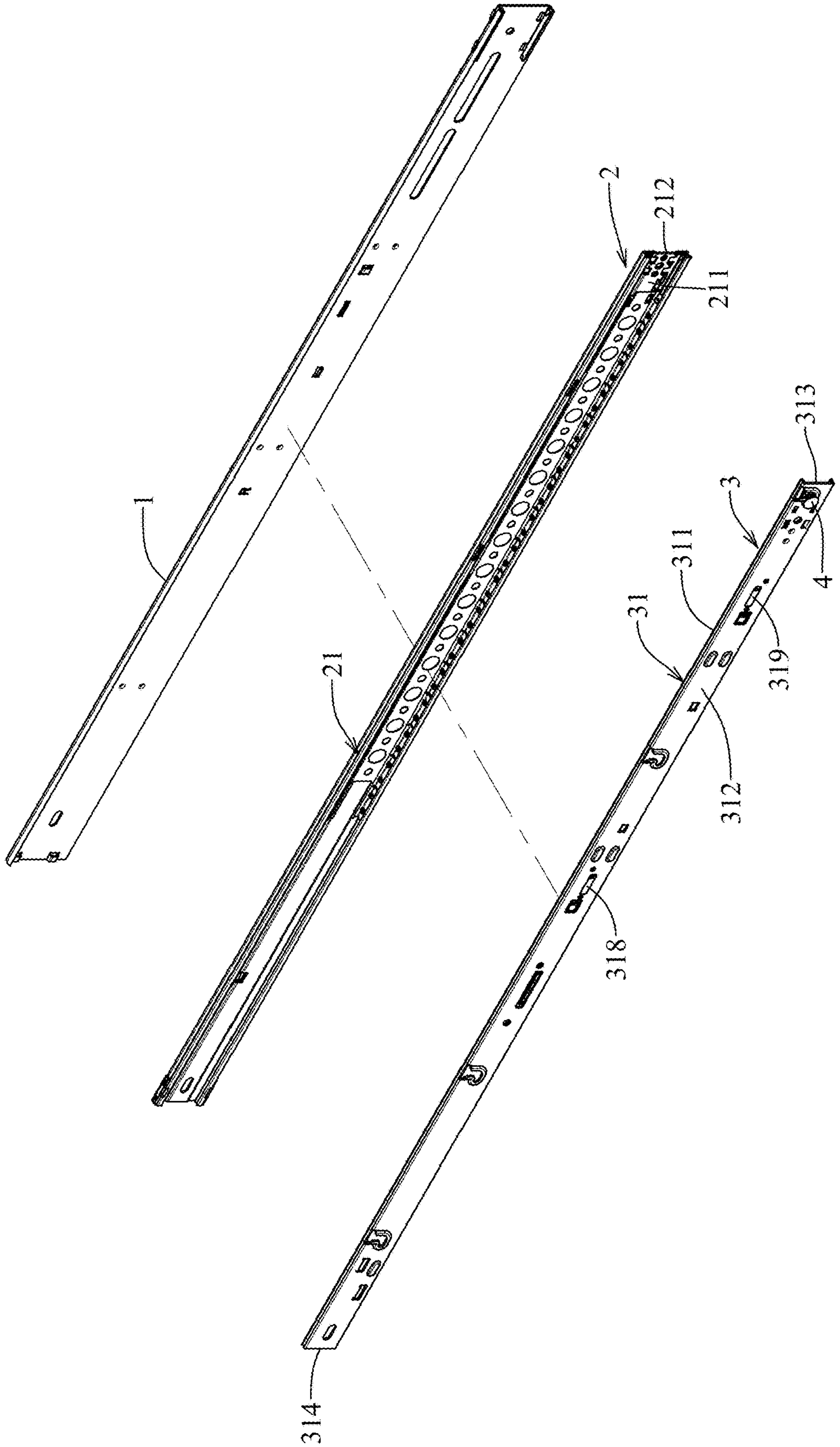
FIG. 2 is an exploded perspective view of the embodiment.
Figure 3:
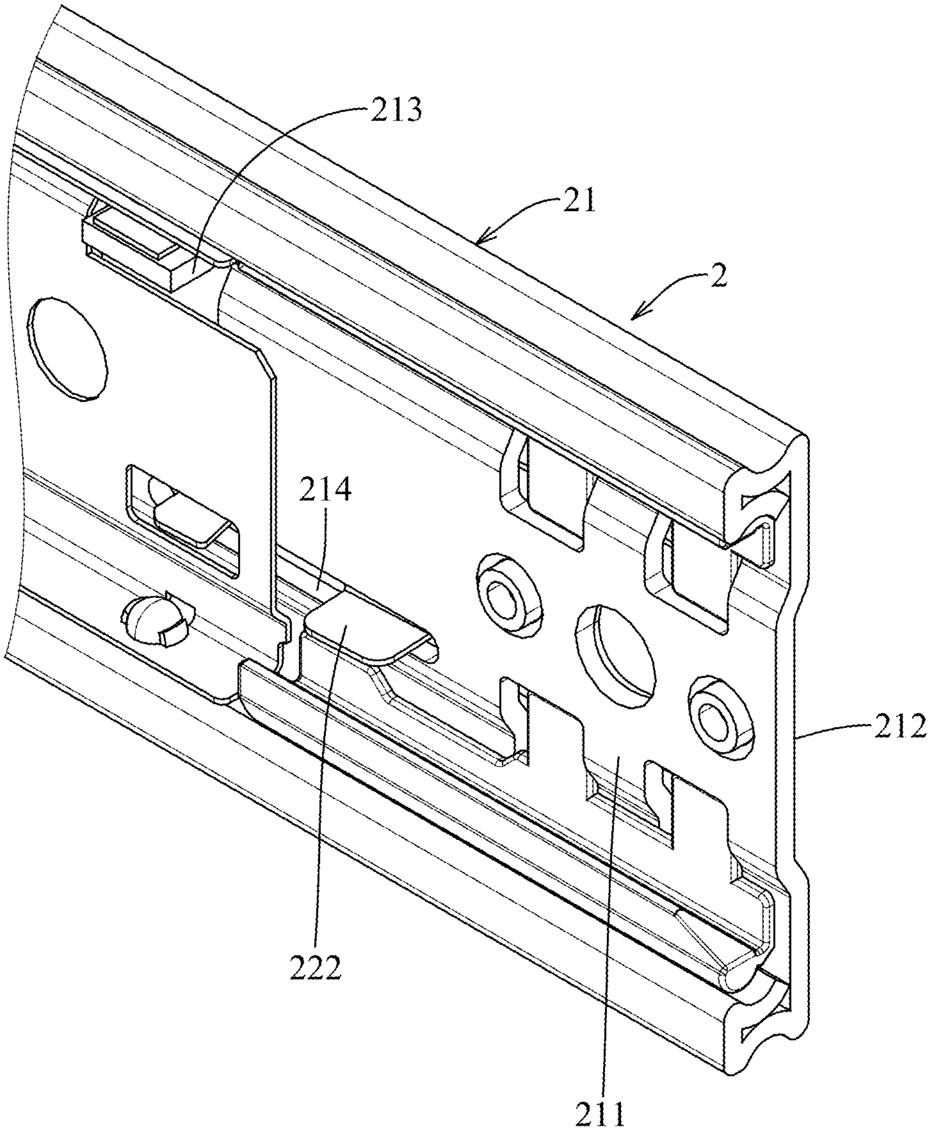
FIG. 3 is a fragmentary perspective view of a middle rail unit of the embodiment.
Figure 4:
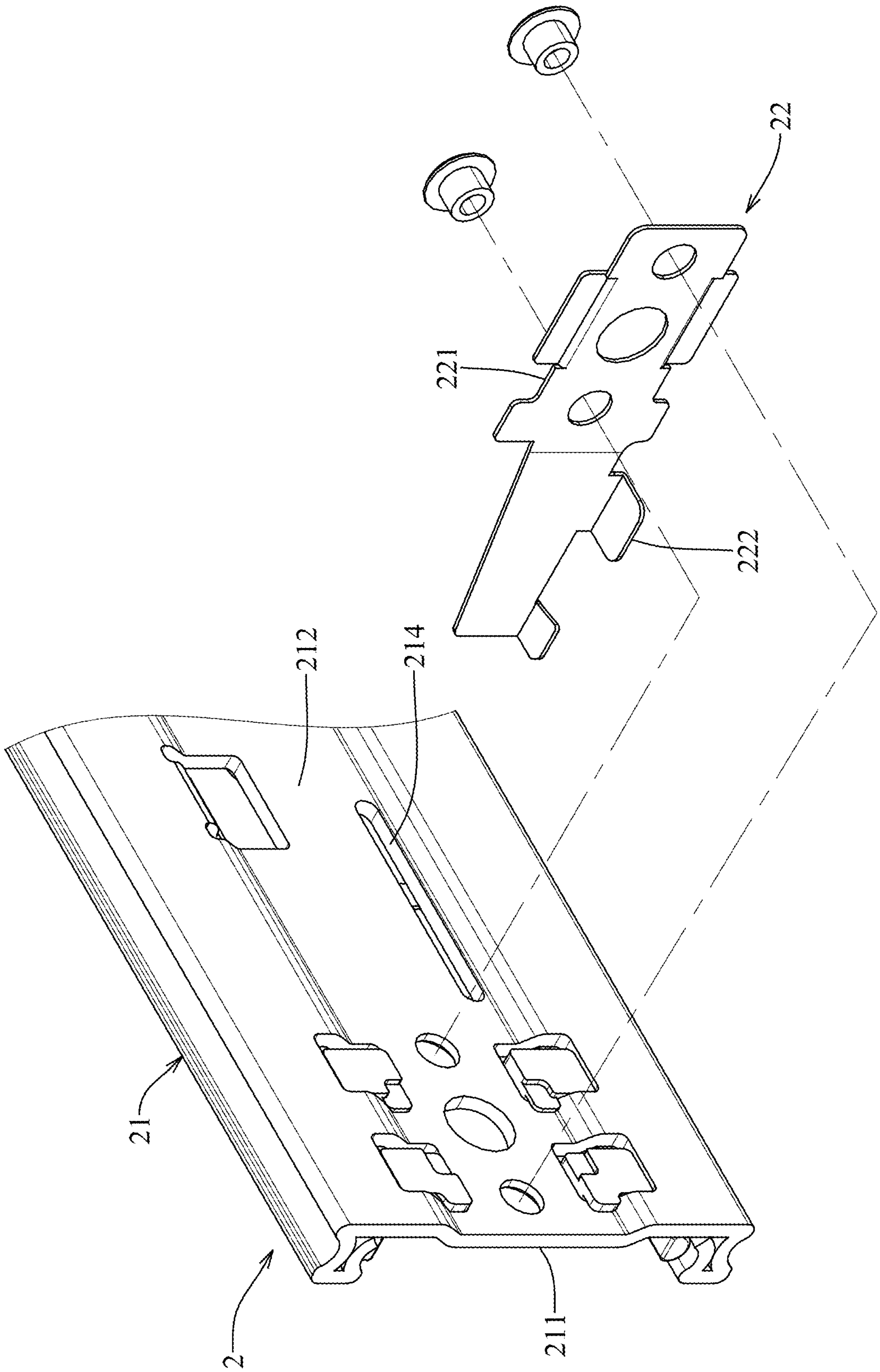
FIG. 4 is a fragmentary, exploded perspective view of the middle rail unit of the embodiment.

Referring to FIGS. 1 and 2, an embodiment of a slide rail device according to the disclosure is adapted to be mounted on a server rack (not shown) for connecting with and supporting a server case 20. It is noted that a pair of slide rail devices are mounted on the server rack at two sides of the server case 20. The server case 20 has an engaging member 4. The slide rail device includes an outer rail 1, a middle rail unit 2 and an inner rail unit 3. The outer rail 1 is securely disposed on the server rack. The inner rail unit 3 is connected with a side of the server case 20.

With reference to FIGS. 3 to 6, the middle rail unit 2 includes a middle rail 21 which is disposed on and longitudinally slidable along the outer rail 1, and a return abutting member 21 which is disposed on the middle rail 21. The middle rail 21 has an inward facing rail surface 211 facing the inner rail unit 3, an outward facing rail surface 212 transversely opposite to the inward facing rail surface 211, a through slot 214 extending transversely therethrough, and a stop member 213 projecting toward the inner rail unit 3. The return abutting member 22 has a plate mounting portion 221 which is disposed on the outward facing rail surface 212, and a return abutting portion 222 which extends transversely from and bends relative to the plate mounting portion 221 toward the inner rail unit 3 and extends through the through slot 214. The inner rail unit 3 includes an inner rail 31 which is disposed on and longitudinally slidable along the middle rail 21, a lock member 32 which is disposed on the inner rail 31, a releasing member 33 which is disposed on the inner rail 31 and movably connected with the lock member 32, a first stopped and release operating assembly 34 which is disposed on the inner rail 31, a second stopped and release operating assembly 35 which is disposed on the inner rail 31, and a return biasing member 36 which is connected between the first and second stopped and release operating assemblies 34, 35. The inner rail 31 has an inner rail surface 311 facing the middle rail 21, an outer rail surface 312 transversely opposite to the inner rail surface 311 and facing the server case 20, a first end 313, a second end 314 longitudinally opposite to the first end 313, an engaging slot 315 formed therethrough and adjacent to the first end 313 for the engaging member 4 of the server case 20 to be transversely inserted thereinto, two releasing slots 316 formed adjacent to the engaging slot 315, two releasing slope surfaces 317 respectively formed in the two releasing slots 316 and engaging the inner rail surface 311, a first guide slot 318 and a second guide slot 319.

Figure 5:
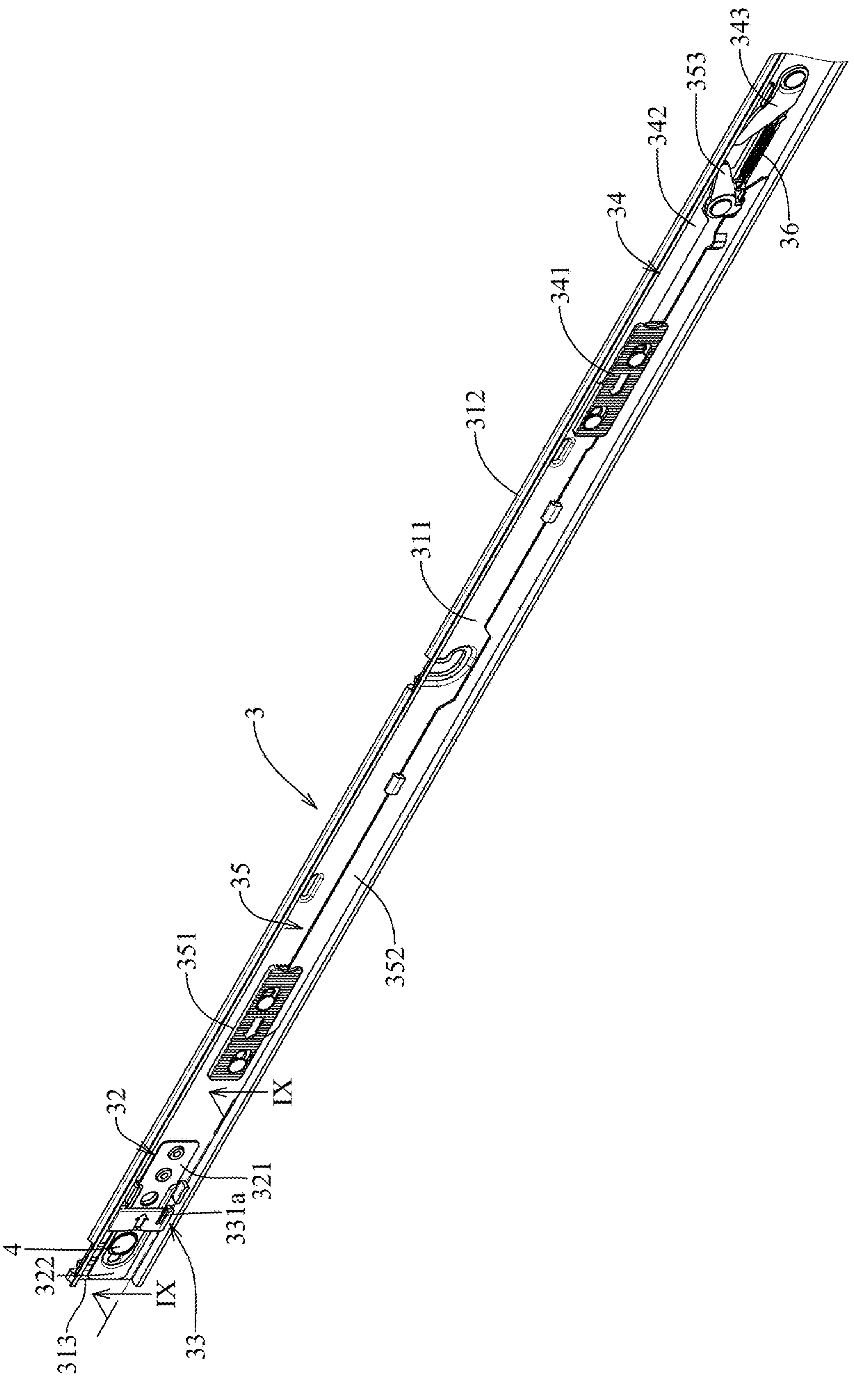
FIG. 5 is a fragmentary perspective view of an inner rail unit of the embodiment.
Figure 6:
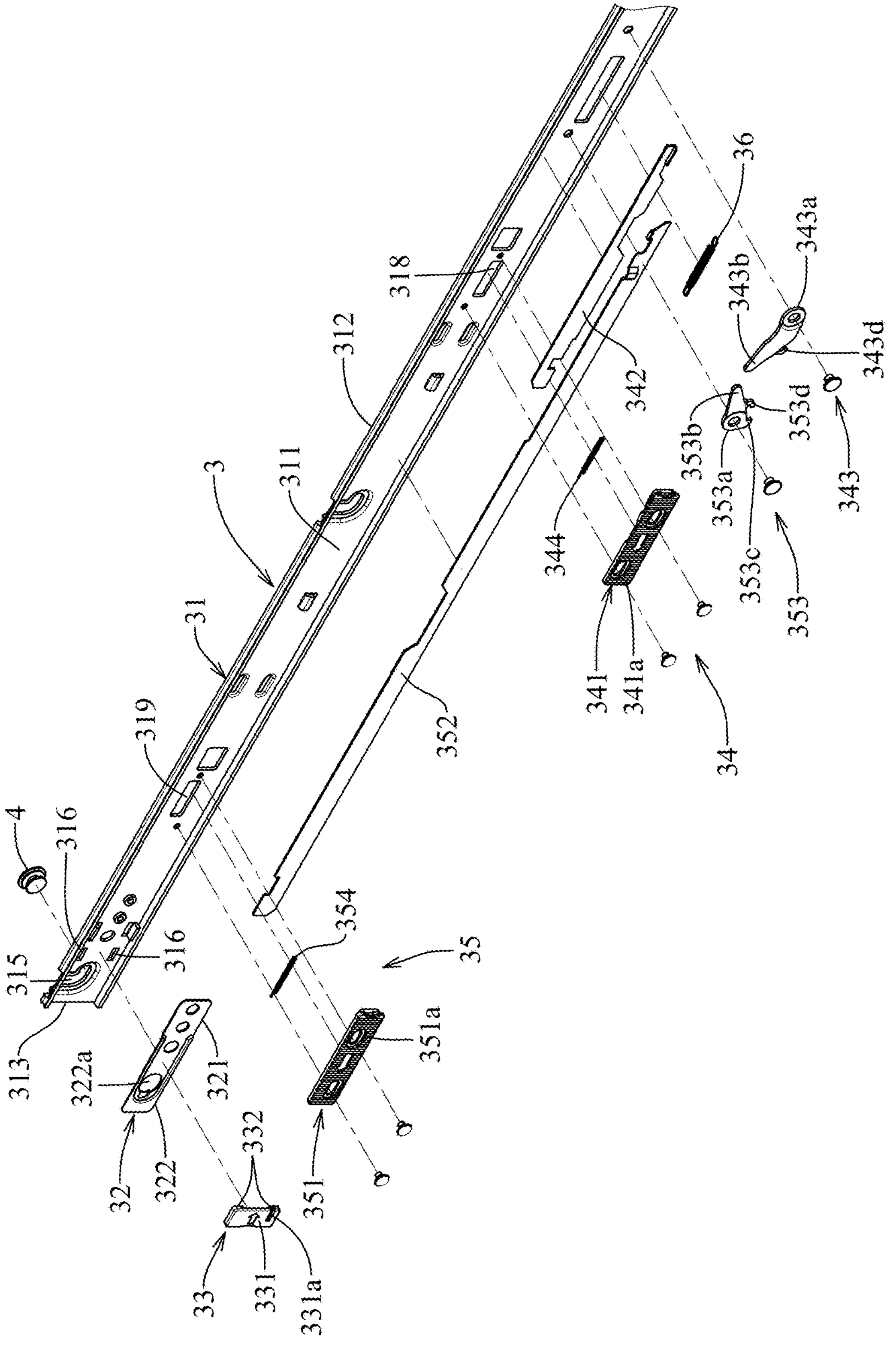
FIG. 6 is a fragmentary, exploded perspective view of the inner rail unit of the embodiment.
Figure 7:
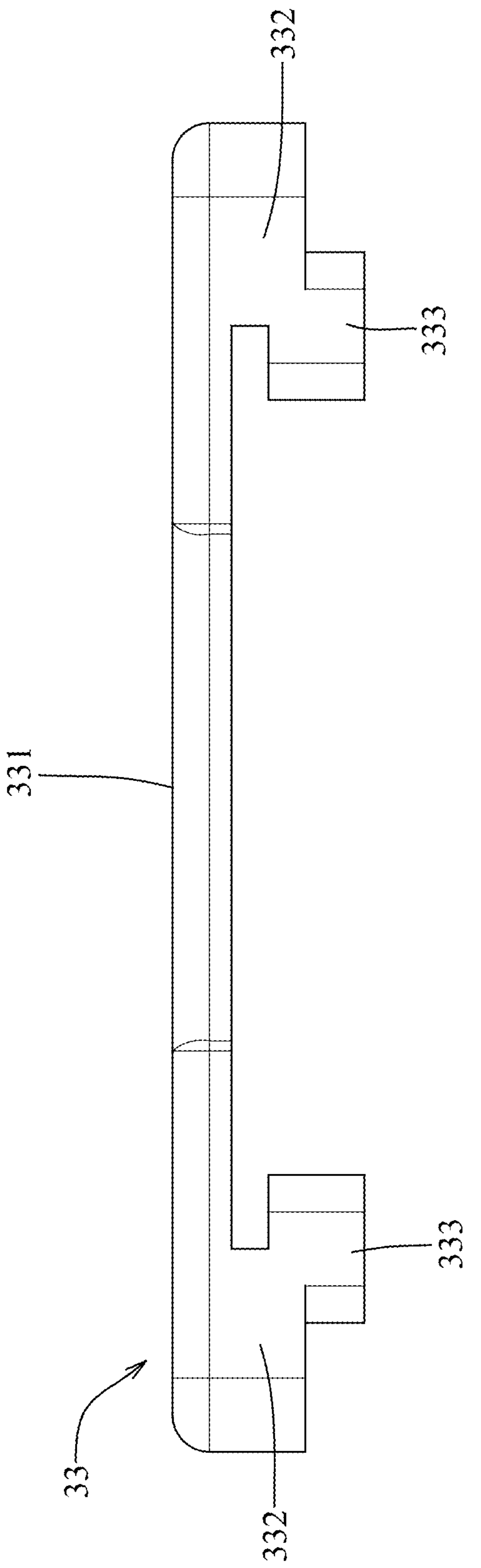
FIG. 7 is a side view of a releasing member of the inner rail unit of the embodiment.
Figure 8:
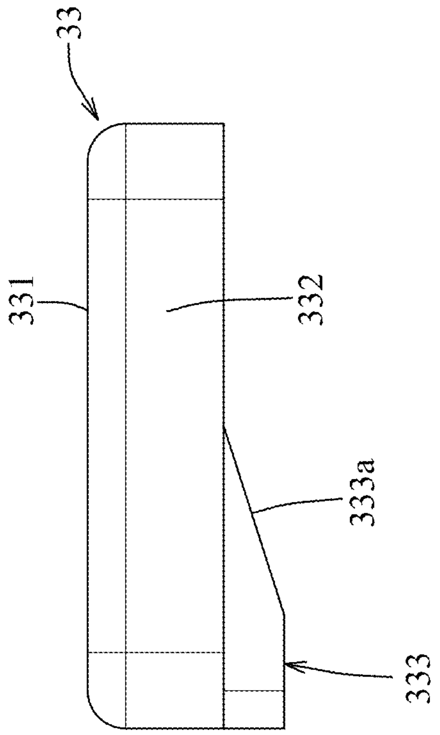
FIG. 8 is a bottom view of the releasing member.
Figure 9:
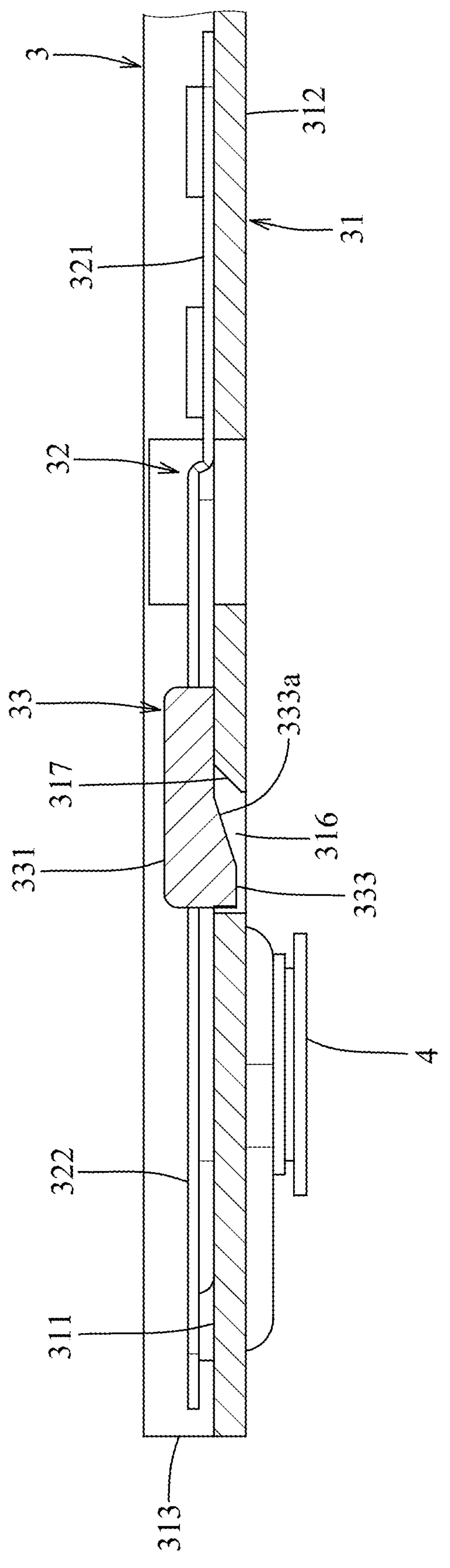
FIG. 9 is a fragmentary sectional view taken along line IX-IX of FIG. 5.
Figure 10:
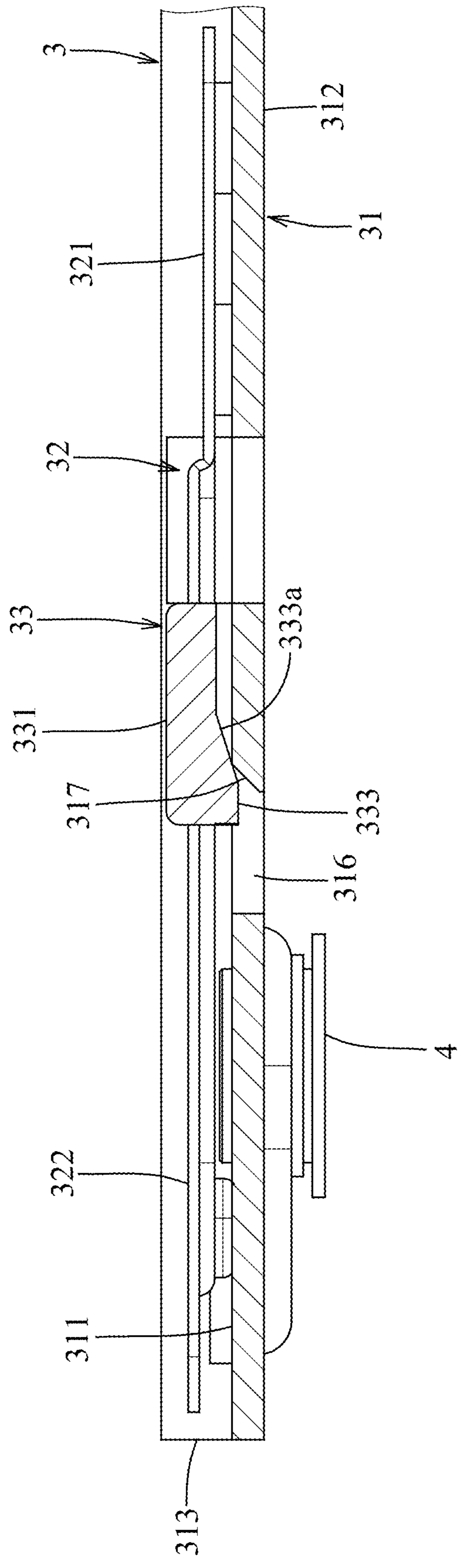
FIG. 10 is a fragmentary sectional view similar to FIG. 9, illustrating a state when the releasing member moves a lock member away from an inner rail.
Figure 11:
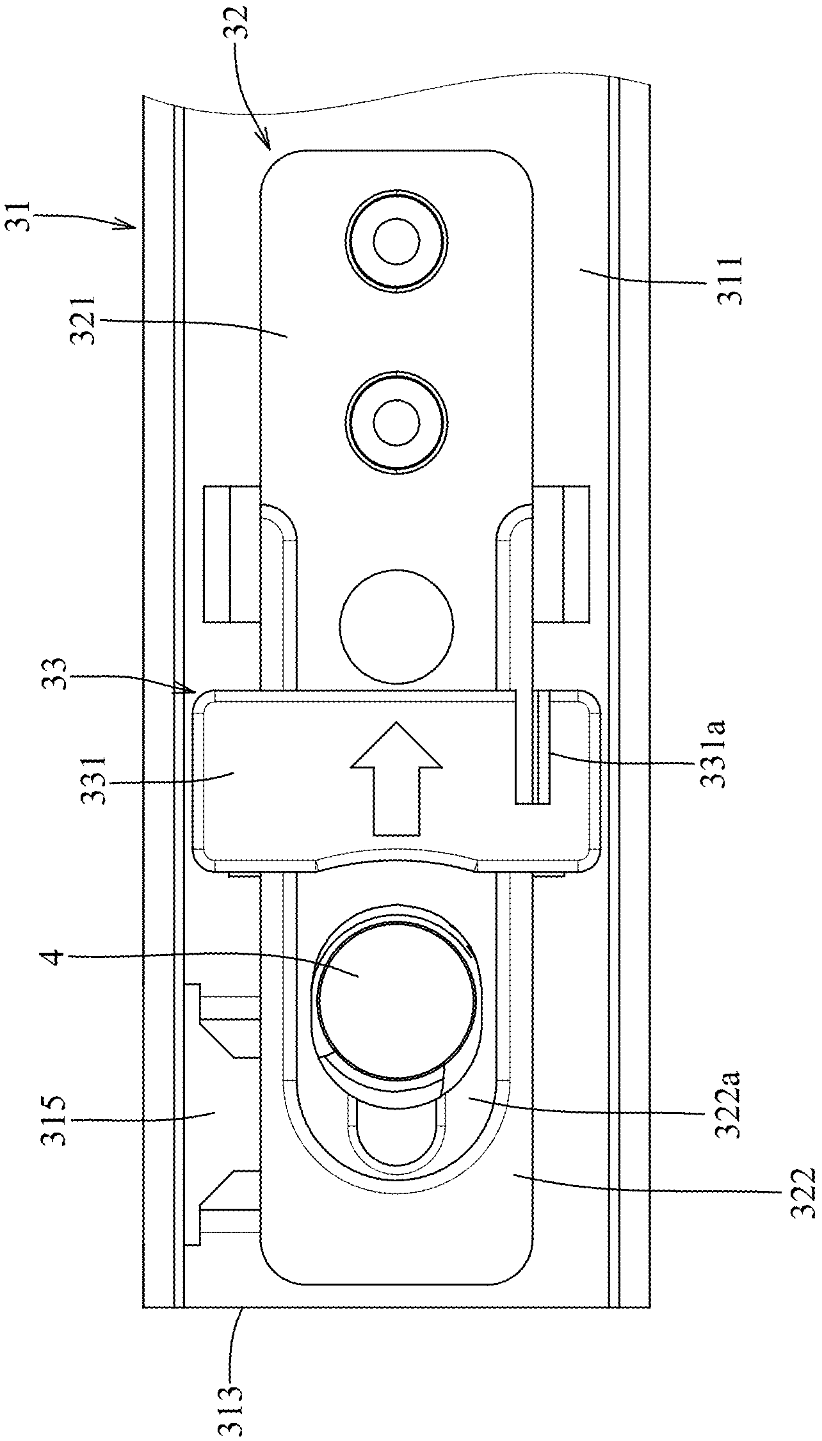
FIG. 11 is a fragmentary front view of the inner rail unit of the embodiment.
Figure 12:
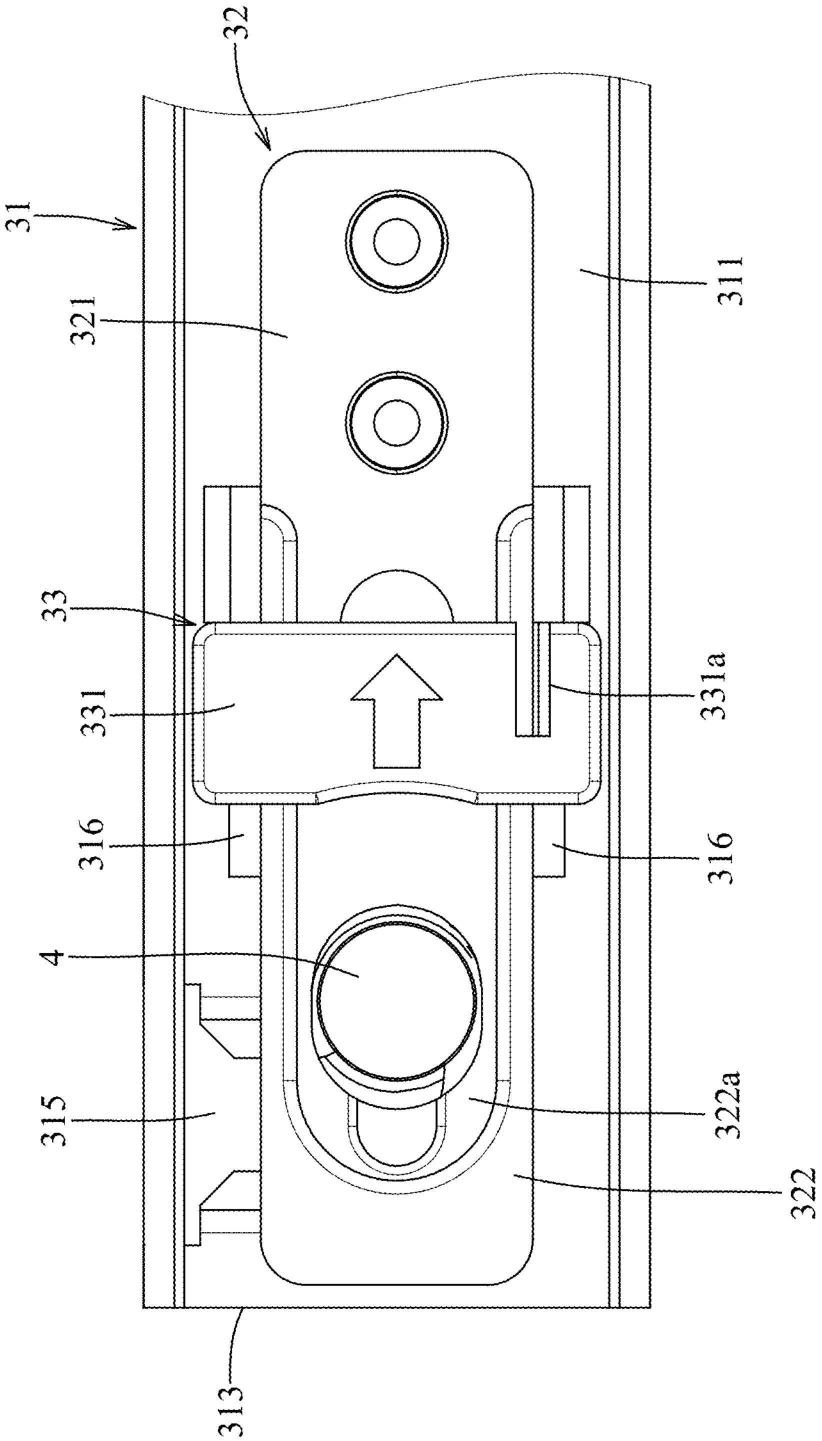
FIG. 12 is a fragmentary front view similar to FIG. 11, illustrating a state when the releasing member moves the lock member away from the inner rail.

With reference to FIGS. 5 to 7, the lock member 32 is in the form of an elongated plate, and has a mounting portion 321 which is securely mounted on the inner rail surface 311, and an engaging portion 322 which extends longitudinally from the mounting portion 321 to be engageable with the engaging member 4 and is deflectable relative to the mounting portion 321. The engaging portion 322 has a circular engaging hole **322*a* for the engaging member 4 to be transversely inserted thereinto and to be engaged therein so as to prevent removal of the engaging member 4 from the engaging slot 315. The releasing member 33 has an operating portion 331, two lateral portions 332 which respectively extend from two opposite sides of the operating portion 331 toward the inner rail surface 311, and two abutting portions 333 which respectively extend from the lateral portions 332 toward the inner rail surface 311. The operating portion 331 is formed with an engaging notch 331*a* for insertion of the return abutting portion 222 thereinto (see FIG. 3). The operating portion 331 and the two lateral portions 332 cooperatively and movably straddle the mounting portion 321 of the lock member 32. Each of the two abutting portions 333 is inserted into the corresponding releasing slot 316, and has an abutting slope 333*a* which is in abutting engagement with the corresponding releasing slope surface 317 of the inner rail 31. In the embodiment, the releasing member 33** is made of a plastic material.

With reference to FIG. 1 and FIGS. 9 to 12, the operating portion 331 of the releasing member 33 is operable to be moved in a direction away from the first end 313 (rightwardly in the drawing) to make the abutting slope **333*a* abut against the corresponding releasing slope surface 317 of the inner rail 31, which brings movement of the releasing member 33 away from the inner rail surface 311, and deflection of the engaging portion 322 of the lock member 32 away from the inner rail surface 311 so as to release the engagement of the engaging portion 322 from the engaging member 4. In this state, the user can remove the server case 20 and the engaging member 4 from the engaging slot 315 so as to detach the server case 20 from the inner rail 31. Thus, a releasing operation of the engaging portion 322 from the engaging member 4 is easy to conduct through pressing of the operating portion 331 of the releasing member 33. With the releasing member 33** made of a plastic material, the risk of scratching the user's hands during the releasing operation is reduced.

Figure 13:
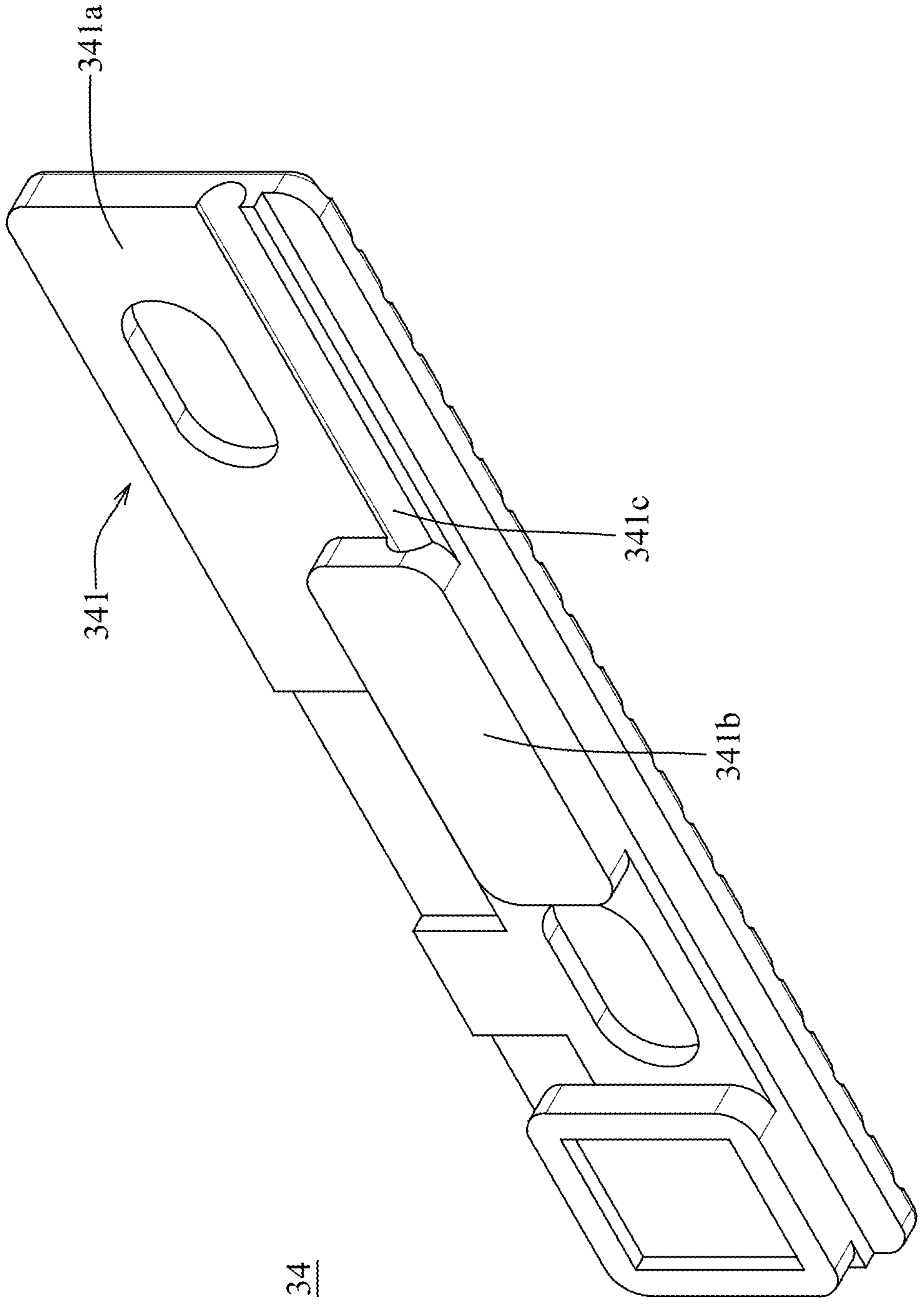
FIG. 13 is a perspective view of a first release operating member of a first stopped and release operating assembly of the inner rail unit of the embodiment.

With reference to FIGS. 5, 6 and 13, the first stopped and release operating assembly 34 includes a first release operating member 341 which is movably disposed on the inner rail 31, a first release transmitting member 342 which is connected and moved with the first release operating member 341, a first stopped pivot member 343 which is pivotably disposed on the inner rail 31 to be stopped by and engaged with the stop member 213 when the inner rail unit 3 slides along the middle rail 21 in an extended direction, and a first biasing member 344 which is disposed between the inner rail 31 and the first release operating member 341 to bias the first release operating member 341 to return to an original position thereof. Specifically, the first release operating member 341 has a plate portion **341*a* which is disposed parallel to the inner rail surface 311, a key portion 341*b* which protrudes from the plate portion 341*a* toward the inner rail surface 311 to be inserted into the first guide slot 318, and a spring receiving slot 341*c* which is formed between the plate portion 341*a* and the key portion 341*b* for receiving the first biasing member 344 therein. The first biasing member 344 has a portion received in the first guide slot 318, and an end in abutting engagement with the inner rail 31. The first stopped pivot member 343 has a pivot portion 343*a* pivotably connected with the inner rail surface 311, a stopped portion 343*b* extending upwardly from and inclined relative to the pivot portion 343*a* and in abutting engagement with an upper edge of the inner rail 31 (see FIG. 5), and a hook portion 343*d* disposed on the stopped portion 343*b* adjacent to the pivot portion 343*a*. The first release transmitting member 342 is an elongated plate which has a thrust end portion 342*a* in abutting engagement with the stopped portion 343*b* (see FIG. 17**).

Figure 14:
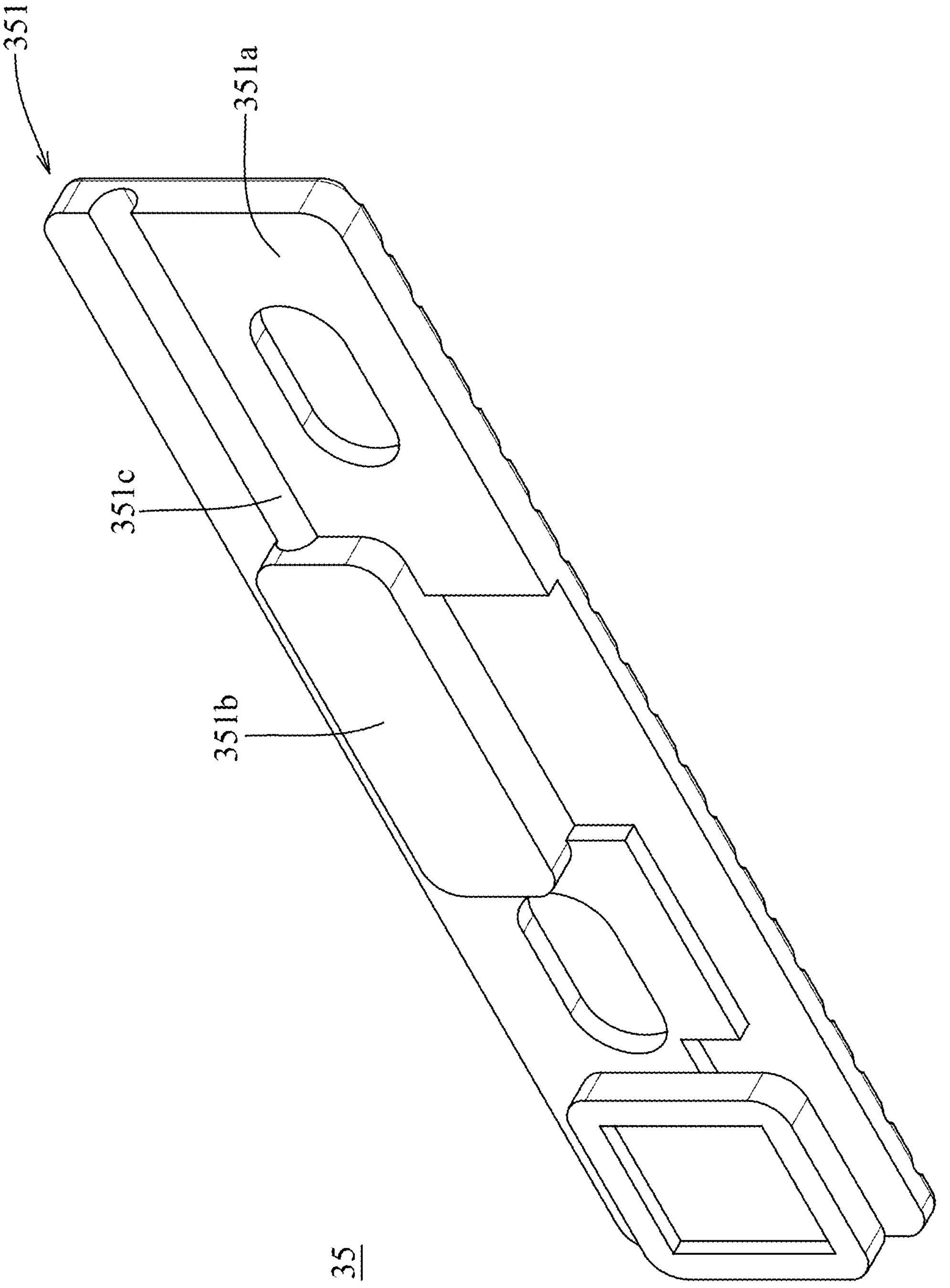
FIG. 14 is a perspective view of a second release operating member of a second stopped and release operating assembly of the inner rail unit of the embodiment.

With reference to FIGS. 5, 6 and 14, the second stopped and release operating assembly 35 includes a second release operating member 351 which is movably disposed on the inner rail 31, a second release transmitting member 352 which is connected and moved with the second release operating member 351, a second stopped pivot member 353 which is pivotably disposed on the inner rail 31 to be stopped by and engaged with the stop member 213 when the inner rail unit 3 slides along the middle rail 21 in a retreating direction, and a second biasing member 354 which is disposed between the inner rail 31 and the second release operating member 351 to bias the second release operating member 351 to return to an original position thereof. Specifically, the second release operating member 351 has a plate portion 351*a* which is disposed parallel to the inner rail surface 311, a key portion 351*b* which protrudes from the plate portion 351*a* toward the inner rail surface 311 to be inserted into the second guide slot 319, and a spring receiving slot 351*c* which is formed between the plate portion 351*a* and the key portion 351*b* for receiving the second biasing member 354 therein. The second biasing member 354 has a portion received in the second guide slot 319, and an end in abutting engagement with the inner rail 31. The second stopped pivot member 353 has a pivot portion 353*a* pivotably connected with the inner rail surface 311, a stopped portion 353*b* extending upwardly from and inclined relative to the pivot portion 353*a* and in abutting engagement with an upper edge of the inner rail 31 (see FIG. 5), an actuated portion 353*c* extending downwardly from the pivot portion 353*a*, and a hook portion 353*d* disposed on the stopped portion 353*b* adjacent to the pivot portion 353*a*. The second release transmitting member 352 is an elongated plate which has a thrust end portion 352*a* in abutting engagement with the actuated portion 353*c* (see FIG. 17). The return biasing member 36 has two ends respectively connected with the hook portions 343*d*, 353*d* of the first and second stopped pivot members 343, 353 to bias the first stopped pivot member 343 to return to an original position thereof and to bias the second stopped pivot member 353 to return to an original position thereof.

Figure 15:
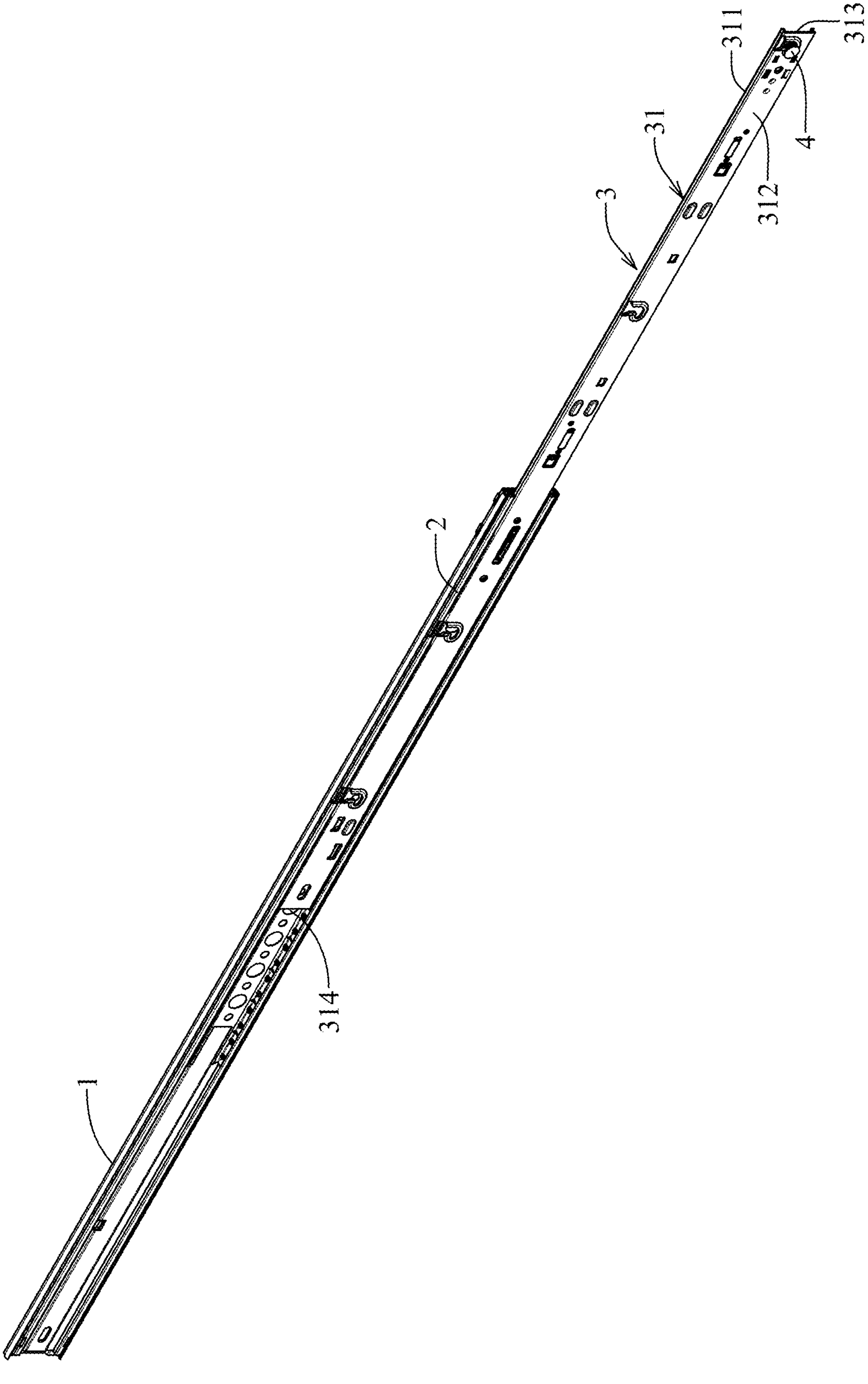
FIG. 15 is a perspective view of the embodiment, illustrating a state when the inner rail unit is in an extended position relative to the middle rail unit.
Figure 16:
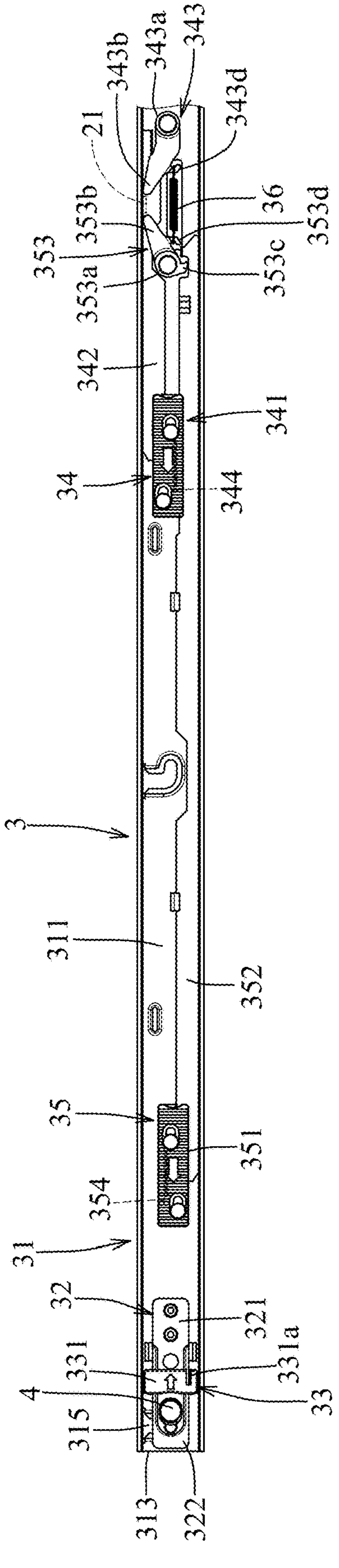
FIG. 16 is a fragmentary front view of the inner rail unit of the embodiment.
Figure 17:
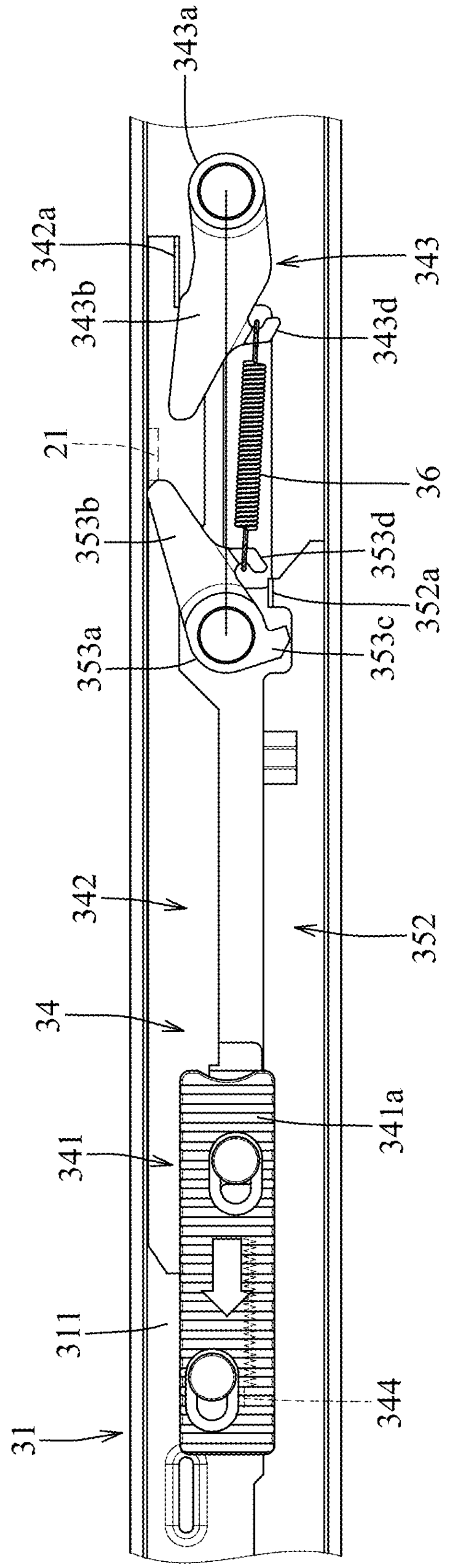
FIG. 17 is a fragmentary front view of the inner rail unit, illustrating a state when the first release operating member is pressed leftwardly to bring a first stopped pivot member to turn downwardly.

With reference to FIG. 1 and FIGS. 15 to 17, the inner rail unit 3 is slidable relative to the middle rail 21 to an extended position, as shown in FIG. 15. In this position, as shown in FIG. 16, the first and second stopped pivot members 343, 353 are stopped by and engaged with the stop member 213 of the middle rail 21 so as to position the inner rail 31 relative to the middle rail 21 to restrict a pull-out movement of the inner rail 31 relative to the middle rail 21 and to prevent undesired removal of the inner rail unit 3 from the middle rail 21. Also, a retreating movement of the inner rail unit 3 to the middle rail 21 is prevented. For conducting maintenance work of the server case 20, the server case 20 and the inner rail unit 3 need to be removed from the middle rail 21, and the releasing operation described previously needs to be performed. Firstly, the first release operating member 341 is pressed leftwardly to move the first release transmitting member 342 leftwardly such that the thrust end portion 342*a* abuts and presses the stopped portion 343*b* to turn the first stopped pivot member 343 downwardly so as to release the engagement of the inner rail unit 3 from the stop member 213 to permit a pull-out movement (a leftward movement in the drawing) of the inner rail unit 3 relative to the middle rail 21, as shown in FIG. 17. During the leftward operation of the first release operating member 341, the first biasing member 344 is compressed to bias the first release operating member 341 to return to the original position thereof when the leftward operation is stopped, and the first stopped pivot member 343 is turned to the original position thereof.

Figure 18:
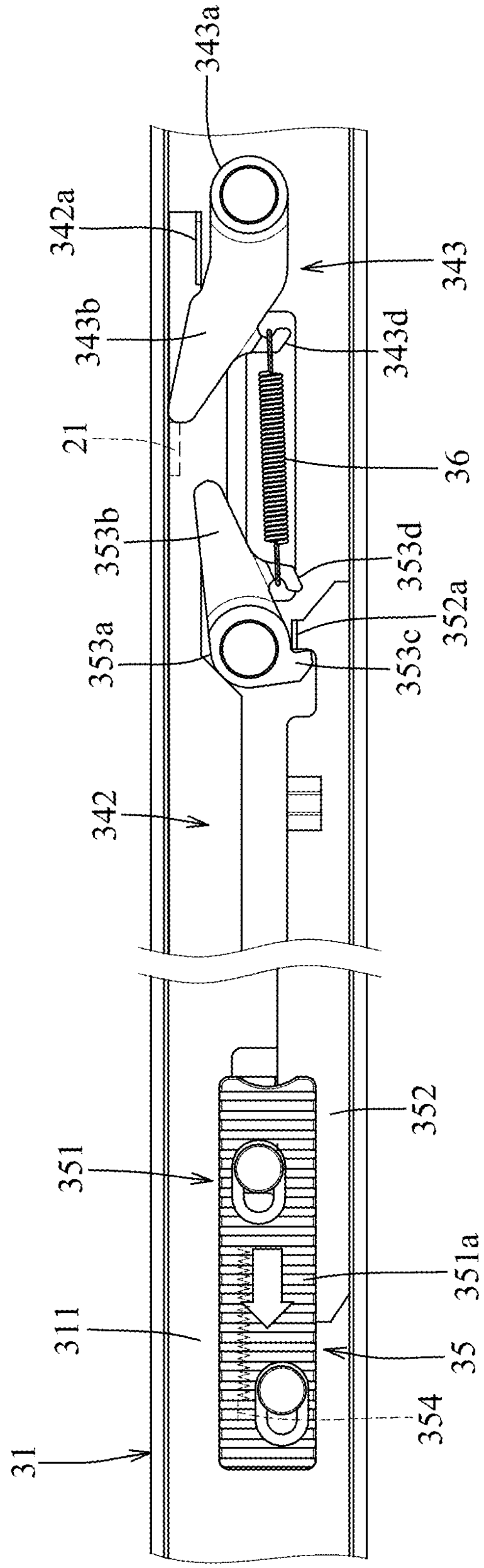
FIG. 18 is a fragmentary front view of the inner rail unit, illustrating a state when the second release operating member is pressed leftwardly to bring a second stopped pivot member to turn downwardly.

With reference to FIGS. 1, 16 and 18, thereafter, when it is desired to assemble the inner rail unit 3 back to the middle rail 21, the server case 20 and the inner rail unit 3 are pressed rightwardly toward the middle rail 21, and the second release operating member 351 is pressed leftwardly to move the second release transmitting member 352 leftwardly such that the thrust end portion 352*a* abuts and presses the actuated portion 353*c* to turn the second stopped pivot member 353 downwardly so as to release the engagement of the inner rail unit 3 from the stop member 213 and to permit the retreating movement (a rightward movement in the drawing) of the inner rail unit 3 relative to the middle rail 21, as shown in FIG. 18. During the leftward operation of the second release operating member 351, the second biasing member 354 is compressed to bias the second release operating member 351 to return to the original position thereof when the leftward operation is stopped, and the second stopped pivot member 353 is turned to the original position thereof.

Figure 19:
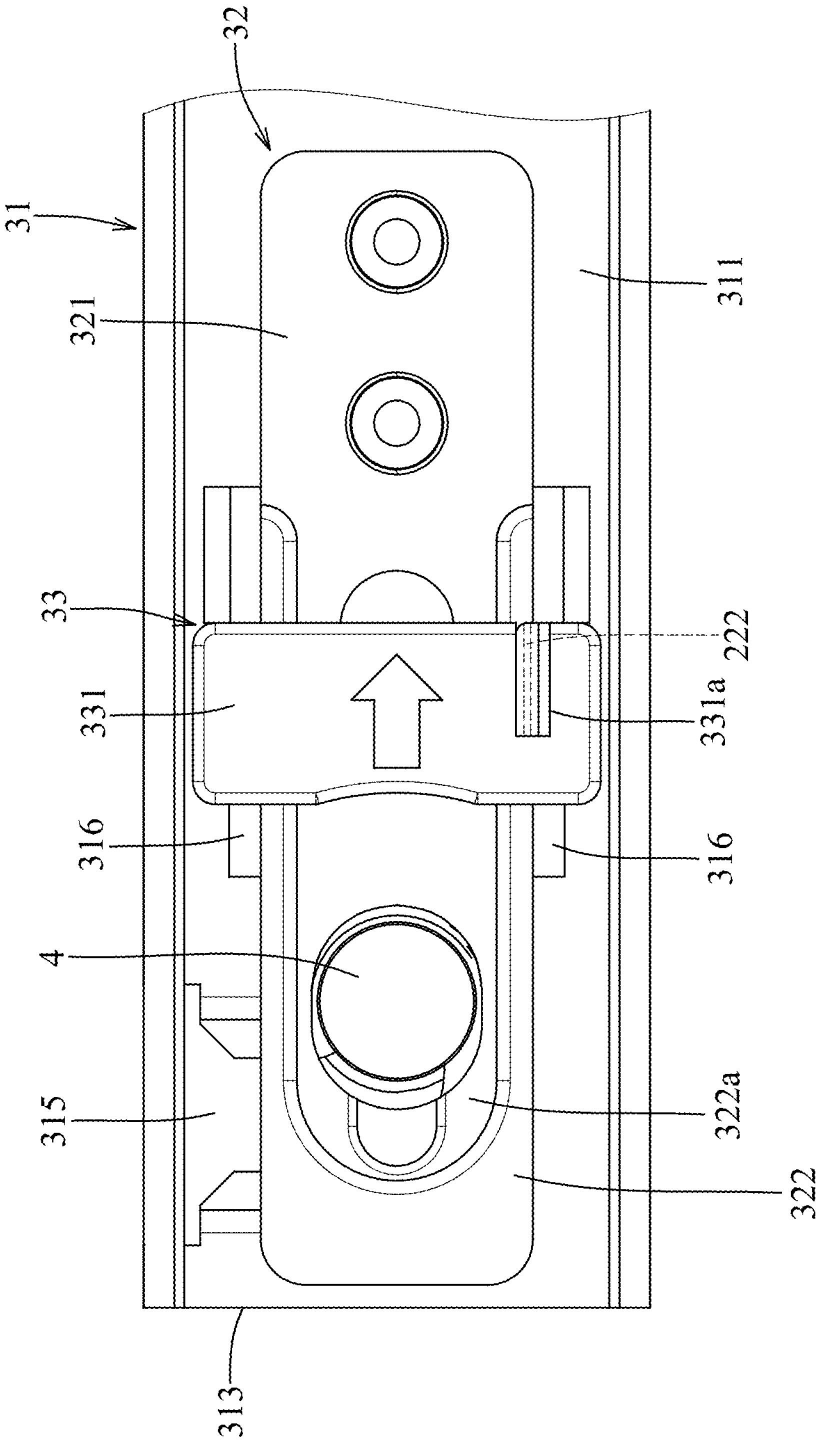
FIG. 19 is a fragmentary front view of the inner rail unit, illustrating a state when the releasing member is in abutting engagement with a return abutting member.
Figure 20:
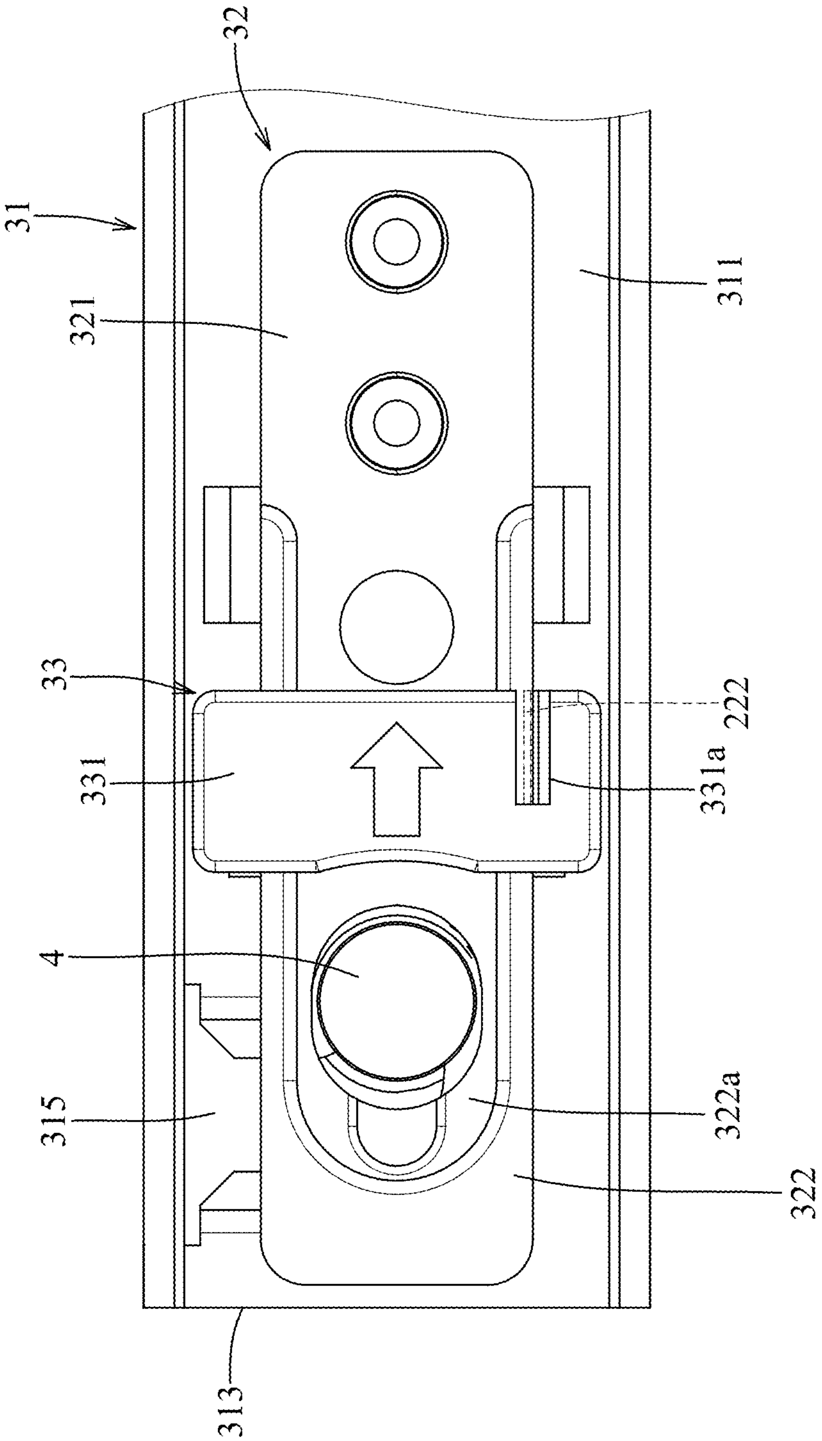
FIG. 20 is a fragmentary front view similar to FIG. 19, illustrating a state when the return abutting member abuts and presses the releasing member to return to an original position thereof.

With reference to FIGS. 1, 19 and 20, during the sliding movement of the inner rail unit 3 relative to the middle rail 21 in the retreating direction, the return abutting portion 222 of the return abutting member 22 is inserted into the engaging notch 331*a* to be abuttingly engaged with the operating portion 331 of the releasing member 33, as shown in FIG. 19. Subsequently, along with the sliding movement of the inner rail unit 3, the releasing member 33 is pressed by the return abutting portion 222 of the return abutting member 22 toward the first end 314 to return to an original position thereof, as shown in FIG. 20. With such structure, the lock member 32 is moved automatically to be engaged with the engaging member 4 when the inner rail unit 3 is assembled again to the middle rail unit 2 and slides along the middle rail 21 in the retreating direction, which prevents falling of the server case 20 from the inner rail unit 3 that may cause damage to other server cases or injuries to the user when the releasing member 33 is not manually operated to return to the original position thereof.

As illustrated, with the return abutting member 22 abutting and pressing the releasing member 33 to return to the original position thereof, the lock member 32 is permitted to be engaged with the engaging member 4 without any manual operation. Thus, undesired removal of the server case 20 from the inner rail unit 3 is prevented.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A slide rail device for connecting with a server case, the server case having an engaging member, comprising:

a middle rail unit including a middle rail and a return abutting member which is disposed on said middle rail; and an inner rail unit including an inner rail which is disposed on and longitudinally slidable along said middle rail, a lock member which is disposed on said inner rail, and a releasing member which is disposed on said inner rail and movably connected with said lock member, said inner rail having an inner rail surface facing said middle rail, a first end, a second end longitudinally opposite to said first end, and an engaging slot formed therethrough for the engaging member to be transversely inserted thereinto, said lock member being engageable with the engaging member to prevent removal of the engaging member from said engaging slot, said releasing member being operably moved longitudinally toward said second end to abut and press said lock member away from said inner rail surface so as to release engagement of said lock member from the engaging member, wherein, during sliding movement of said inner rail unit relative to said middle rail in a retreating direction, said releasing member is moved to be in abutting engagement with and pressed by said return abutting member to return toward said first end to an original position thereof.

2. The slide rail device of claim 1, wherein said middle rail has an inward facing rail surface facing said inner rail surface of said inner rail, an outward facing rail surface transversely opposite to said inward facing rail surface, and a through slot extending transversely therethrough, said return abutting member having a plate mounting portion which is disposed on said outward facing rail surface, and a return abutting portion which extends transversely from and bends relative to said plate mounting portion toward said inner rail and extends through said through slot.

3. The slide rail device of claim 2, wherein said lock member has a mounting portion which is securely mounted on said inner rail surface, and an engaging portion which extends longitudinally from said mounting portion to be engageable with the engaging member and is deflectable relative to said mounting portion, said engaging portion having an engaging hole for the engaging member to be transversely inserted thereinto and to be engaged therein.

4. The slide rail device of claim 3, wherein said inner rail has two releasing slots, said engaging slot being located closer to said first end than said releasing slots, said releasing member having an operating portion which is in abutting engagement with said return abutting portion, two lateral portions which respectively extend from two opposite sides of said operating portion toward said inner rail surface, and two abutting portions which respectively extend from said lateral portions toward said inner rail surface, said operating portion and said two lateral portions cooperatively and movably straddling said mounting portion of said lock member, each of said two abutting portions being inserted into a respective one of said releasing slots, and having an abutting slope which is in abutting engagement with said inner rail, wherein said operating portion is operably moved in a direction away from said first end to make said abutting slope abut against said inner rail, which brings movement of said releasing member away from said inner rail surface, and deflection of said engaging portion of said lock member away from said inner rail surface so as to release engagement of said engaging portion from the engaging member.

5. The slide rail device of claim 4, wherein said operating portion is formed with an engaging notch for insertion of said return abutting portion thereinto.

6. The slide rail device of claim 1, wherein said middle rail has a stop member which projects toward said inner rail surface of said inner rail, said inner rail unit further including a first stopped and release operating assembly which is disposed on said inner rail, said first stopped and release operating assembly including a first release operating member which is movably disposed on said inner rail, a first release transmitting member which is connected and moved with said first release operating member, and a first stopped pivot member which is pivotably disposed on said inner rail to be stopped by and engaged with said stop member when said inner rail unit slides along said middle rail in an extended direction, wherein said first release transmitting member is in abutting engagement with said first stopped pivot member such that said first release operating member is operable to move said first release transmitting member, which turns said first stopped pivot member so as to release engagement of said first stopped pivot member from said stop member.

7. The slide rail device of claim 6, wherein said first stopped and release operating assembly further includes a first biasing member which is disposed between said inner rail and said first release operating member to bias said first release operating member to return to an original position thereof.

8. The slide rail device of claim 7, wherein said inner rail has a first guide slot, said first release operating member having a plate portion which is disposed parallel to said inner rail surface, a key portion which protrudes from said plate portion toward said inner rail surface to be inserted into said first guide slot, and a spring receiving slot which is formed between said plate portion and said key portion for receiving said first biasing member therein, said first biasing member having a portion received in said first guide slot and an end in abutting engagement with said inner rail.

9. The slide rail device of claim 8, wherein said inner rail unit further includes a second stopped and release operating assembly which is disposed on said inner rail, said second stopped and release operating assembly including a second release operating member which is movably disposed on said inner rail, a second release transmitting member which is connected and moved with said second release operating member, and a second stopped pivot member which is pivotably disposed on said inner rail to be stopped by and engaged with said stop member when said inner rail unit slides along said middle rail in the retreating direction, wherein said second release transmitting member is in abutting engagement with said second stopped pivot member such that said second release operating member is operable to move said second release transmitting member, which turns said second stopped pivot member so as to release engagement of said second stopped pivot member from said stop member.

10. The slide rail device of claim 9, wherein said second stopped and release operating assembly further includes a second biasing member which is disposed between said inner rail and said second release operating member to bias said second release operating member to return to an original position thereof.

11. The slide rail device of claim 10, wherein said inner rail has a second guide slot, said second release operating member having a plate portion which is disposed parallel to said inner rail surface, a key portion which protrudes from said plate portion toward said inner rail surface to be inserted into said second guide slot, and a spring receiving slot which is formed between said plate portion and said key portion for receiving said second biasing member therein, said second biasing member having a portion received in said second guide slot and an end in abutting engagement with said inner rail.

* * * * *